(12) United States Patent
Neidorff et al.

(10) Patent No.: US 11,085,961 B2
(45) Date of Patent: Aug. 10, 2021

(54) POWER TRANSISTOR LEAKAGE CURRENT WITH GATE VOLTAGE LESS THAN THRESHOLD

(71) Applicant: TEXAS INSTRUMENTS INCORPORATED, Dallas, TX (US)

(72) Inventors: Robert Allan Neidorff, Bedford, NH (US); Henry Litzmann Edwards, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 7 days.

(21) Appl. No.: 16/226,318

(22) Filed: Dec. 19, 2018

(65) Prior Publication Data

US 2020/0200815 A1 Jun. 25, 2020

(51) Int. Cl.
*G01R 31/26* (2020.01)
*G01R 31/30* (2006.01)
(Continued)

(52) U.S. Cl.
CPC ..... *G01R 31/2621* (2013.01); *G01R 19/0092* (2013.01); *G01R 19/165* (2013.01); *G01R 31/3008* (2013.01); *G01R 31/50* (2020.01)

(58) Field of Classification Search
CPC .............. H01R 13/703; H01R 13/6683; G01R 19/0092; G01R 19/32; G01R 31/2621; G01R 31/2628; G01R 31/3842; G01R 31/386; G01R 31/389; G01R 31/64; G01R 19/00; G01R 19/10; G01R 19/165; G01R 19/2513; G01R 27/14; G01R 27/2611; G01R 31/26; G01R 31/2619; G01R 31/263; G01R 31/2853; G01R 31/2875; G01R 31/3008; G01R 31/367; G01R 31/374; G01R 31/382; G01R 31/388; G01R 31/392; G01R 31/396; G01R 31/50; G01R 31/52;
(Continued)

(56) References Cited

U.S. PATENT DOCUMENTS

7,230,444 B2 * 6/2007 Saito .................. G01R 31/2601
324/762.09
7,492,206 B2 * 2/2009 Park ...................... G11C 16/08
326/63
(Continued)

*Primary Examiner* — Vinh P Nguyen
(74) *Attorney, Agent, or Firm* — Lawrence J. Bassuk; Charles A. Brill; Frank D. Cimino (57) ABSTRACT

An example method provides a power MOSFET, a voltage source coupled to the power MOSFET, and a current measurement device coupled to a first non-control terminal of the power MOSFET. The voltage source, the current measurement device, and a second non-control terminal of the power MOSFET couple to ground. The method uses the voltage source to apply a voltage between a gate terminal and the second non-control terminal of the power MOSFET, the voltage greater than zero volts and less than a threshold voltage of the power MOSFET. The method also uses the current measurement device to measure a first current flowing through the first non-control terminal while applying the voltage. The method further uses the first current to predict a second current through the first non-control terminal for a voltage between the gate terminal and the second non-control terminal that is approximately zero.

17 Claims, 6 Drawing Sheets

(51) Int. Cl.
   *G01R 19/00*       (2006.01)
   *G01R 19/165*      (2006.01)
   *G01R 31/50*       (2020.01)

(58) Field of Classification Search
   CPC ...... G01R 31/54; G01R 31/58; G01R 35/005; G06F 1/30; G06F 1/3206; G06F 1/3243; G06F 1/3287; G06F 1/3296; G06F 9/30145; G05B 15/02; G05B 2219/24015; G05B 2219/25257; G05B 2219/2637; G05B 23/0283; G05F 1/575; G05F 1/468; H01L 29/417; H01L 29/7302; H01L 29/739; H01L 41/042; G01K 7/015
   See application file for complete search history.

(56) References Cited

U.S. PATENT DOCUMENTS

| | | | | |
|---|---|---|---|---|
| 7,518,378 | B2* | 4/2009 | Mehta | G01R 31/2603 |
| | | | | 324/601 |
| 7,932,724 | B2* | 4/2011 | Voigtlaender | G01R 31/2621 |
| | | | | 324/519 |
| 8,232,781 | B2* | 7/2012 | Marino | G05F 1/573 |
| | | | | 323/271 |
| 8,854,065 | B2* | 10/2014 | Mauder | G01R 19/0092 |
| | | | | 324/691 |
| 9,397,658 | B2* | 7/2016 | Sicard | H02P 27/06 |
| 9,970,980 | B2* | 5/2018 | Bodano | G01R 31/2621 |
| 10,094,863 | B2* | 10/2018 | Bahl | G01R 19/0084 |
| 2021/0011090 | A1* | 1/2021 | Sato | G01R 31/52 |

* cited by examiner

POWER TRANSISTOR LEAKAGE CURRENT WITH GATE VOLTAGE LESS THAN THRESHOLD

SUMMARY

An example method comprises providing a power metal oxide semiconductor field effect transistor (MOSFET), a voltage source coupled to the power MOSFET, and a current measurement device coupled to a first non-control terminal of the power MOSFET. The voltage source, the current measurement device, and a second non-control terminal of the power MOSFET couple to ground. The method comprises using the voltage source to apply a voltage between a gate terminal and the second non-control terminal of the power MOSFET, the voltage greater than zero volts and less than a threshold voltage of the power MOSFET. The method also includes using the current measurement device to measure a first current flowing through the first non-control terminal while applying the voltage. The method further comprises using the first current to predict a second current through the first non-control terminal for a voltage between the gate terminal and the second non-control terminal that is approximately zero.

An example method comprises providing a power metal oxide semiconductor field effect transistor (MOSFET), a variable voltage source coupled to the power MOSFET, and a current measurement device coupled to a first non-control terminal of the power MOSFET, where the variable voltage source, the current measurement device, and a second non-control terminal of the power MOSFET couple to ground. The method comprises applying multiple voltages between a gate terminal of the power MOSFET and the second non-control terminal of the power MOSFET. The method comprises identifying which of the multiple voltages is being applied when a first current through the first non-control terminal reaches a threshold current level. The method comprises using the identified voltage to predict a second current through the first non-control terminal for a voltage between the gate terminal and the second non-control terminal that is approximately zero. The method comprises determining whether the power MOSFET is to be discarded based on the predicted second current.

An example integrated circuit comprises a power metal oxide semiconductor field effect transistor (MOSFET), a first non-control terminal of the power MOSFET coupled to a first IC pin and configured to couple to a current measurement device via the first IC pin. The IC also comprises a switch coupled to a gate terminal of the power MOSFET and to a second IC pin, the switch configured to couple to a voltage source via the second IC pin and to apply a voltage of the voltage source between the gate terminal and a second non-control terminal of the power MOSFET.

An example system comprises an integrated circuit, comprising a first power metal oxide semiconductor field effect transistor (MOSFET) coupled to a voltage source, a second power MOSFET coupled to the first power MOSFET via a node, the second power MOSFET further coupled to ground and the node configured to couple to a load, and a switch coupled to the first power MOSFET. The switch is configured to, responsive to receipt of a first signal, apply a voltage between a gate terminal of the first power MOSFET and a non-control terminal of the first power MOSFET. The switch is configured to, responsive to receipt of a second signal, apply approximately zero volts to the gate terminal of the first power MOSFET.

An example method includes providing a power metal oxide semiconductor field effect transistor (MOSFET), a controllable voltage source coupled to the power MOSFET, and a current measurement device coupled to a first non-control terminal of the power MOSFET, wherein the controllable voltage source, the current measurement device, and a second non-control terminal of the power MOSFET couple to ground. The method includes applying a voltage to turn on a switch coupled to the power MOSFET and the controllable voltage source. The method includes, while the switch is on, controlling the controllable voltage source to apply a voltage pulse to the power MOSFET. The method includes measuring leakage current from the power MOSFET using the current measurement device after the voltage pulse is complete. The method includes determining whether to discard an integrated circuit (IC) containing the power MOSFET based on the measured leakage current.

BRIEF DESCRIPTION OF THE DRAWINGS

For a detailed description of various examples, reference will now be made to the accompanying drawings in which.

DETAILED DESCRIPTION

Power integrated circuits (ICs) often contain one or more power metal oxide semiconductor field effect transistors (MOSFETs) to supply power to loads. Power ICs are commonly used in power switching contexts and find application in, e.g., direct current (DC)-to-DC converters, motor controllers, and other devices.

Power MOSFETs may undesirably leak current. Although a power MOSFET is more likely to leak current with a gate-to-source voltage (Vgs) greater than 0 V, a power MOSFET may even leak current when the gate-to-source voltage (Vgs) is 0 V (assuming an n-type power MOSFET that uses a positive Vgs to form a channel; a similar principle holds true for p-type power MOSFETs). The amount of leakage can be on the order of femtoamps, picoamps, nanoamps, or microamps, depending on process variations and ambient temperature conditions. Leakage is further exacerbated by high ambient temperatures.

Accordingly, during production, it is desirable to identify and discard power MOSFETs that leak excessive current. To this end, leakage current is measured when the Vgs of a power MOSFET is 0 V. However, with such a low Vgs, the leakage current is often too small to accurately distinguish from circuit noise. In addition, such small leakage currents are subject to measurement error. Furthermore, leakage current measured at room temperatures are often used to predict leakage at higher temperatures. These predictions are often flawed, however, because the leakage currents measured at room temperatures are inaccurate for at least those reasons described above.

This disclosure describes various examples of a power MOSFET test system that includes a power MOSFET IC package to enable the test system and that is usable to measure power MOSFET leakage currents more accurately than with other measurement techniques. The power IC includes a power MOSFET and a switch coupled to the gate terminal of the power MOSFET. The test system also includes a controller to control the switch. When the controller closes the switch, a predetermined, fixed Vgs is applied to the power MOSFET, thereby raising the leakage current to levels that can be more accurately measured. The controller then uses the measured leakage current and prior data (e.g., stored in a database) to calculate what the leakage current would be with a Vgs of 0 V. Leakage current at Vgs=0 V is determined because most devices, for example mobile phones, spend large amounts of time with their power MOSFETs having Vgs=0 V. Thus, leakage current when Vgs=0 V is a useful metric. The controller opens the switch to terminate the test. Although the test is conducted at room temperature, the controller uses the calculated leakage current to predict leakage current at higher ambient temperatures.

In another example, the controller applies a variable Vgs to the power MOSFET. The controller measures the drain current until the drain current reaches a predetermined threshold current level. When the drain current reaches the threshold current level, the controller observes the Vgs being applied to the power MOSFET and identifies that Vgs as being the threshold voltage (Vt) for that power MOSFET. The controller then uses the Vt and prior data (e.g., stored in a database) to calculate leakage current when Vgs is 0 V. The controller opens the switch to terminate the test. Although the test is conducted at room temperature, the controller uses the calculated leakage current to predict leakage current at higher ambient temperatures.

By using these systems and techniques to determine the leakage current at Vgs=0 V, various benefits are realized. For example, leakage current is more accurately measured with diminished influence from circuit noise, measurement error, and diode leakage. In addition, leakage current at Vgs=0 V can be readily determined. Furthermore, decisions as to whether to discard the power MOSFET under test can be made quickly during production. Likewise, because the leakage currents are measured accurately at room temperature, they are usable to accurately predict leakage currents at higher ambient temperatures.

Figure 1:
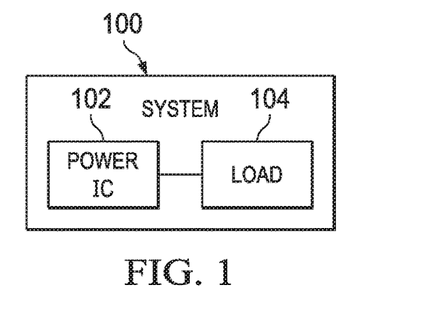
FIG. 1 depicts a block diagram of a system including a power integrated circuit (IC) and a load, in accordance with an example.

FIG. 1 depicts a block diagram of a system 100, which, in an example, is an electronic device such as a smartphone, a laptop computer, or a tablet. Alternatively, the system 100 can more specifically be characterized as a component within such electronic devices, such as a power converter or a motor controller. The system 100 comprises a power IC 102 coupled to a load 104 (e.g., a motor). The power IC 102 provides power to the load 104 in any suitable manner. The power IC 102 has been tested according to the techniques described herein and using the test systems described herein.

Figure 2:
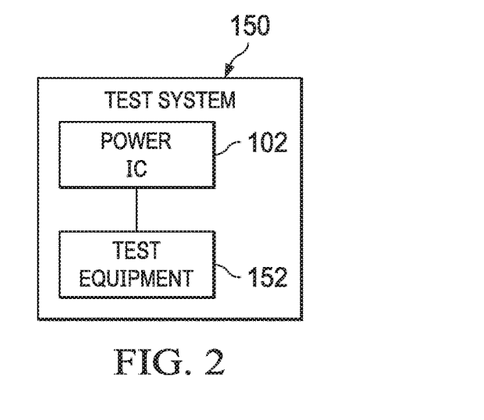
FIG. 2 depicts a block diagram of a test system including a power IC and test equipment, in accordance with an example.

FIG. 2 depicts a block diagram of a test system 150 including a power IC 102 coupled to test equipment 152, in accordance with an example. The test system 150 is, for example, a testing environment composed of various types of test equipment 152 that are usable to determine leakage current in power MOSFETs of the power IC 102. The remainder of this disclosure describes examples of the power IC 102, the test equipment 152, and the manner in which the test equipment 152 is usable to test leakage current in power MOSFETs of the power IC 102.

Figure 3A:
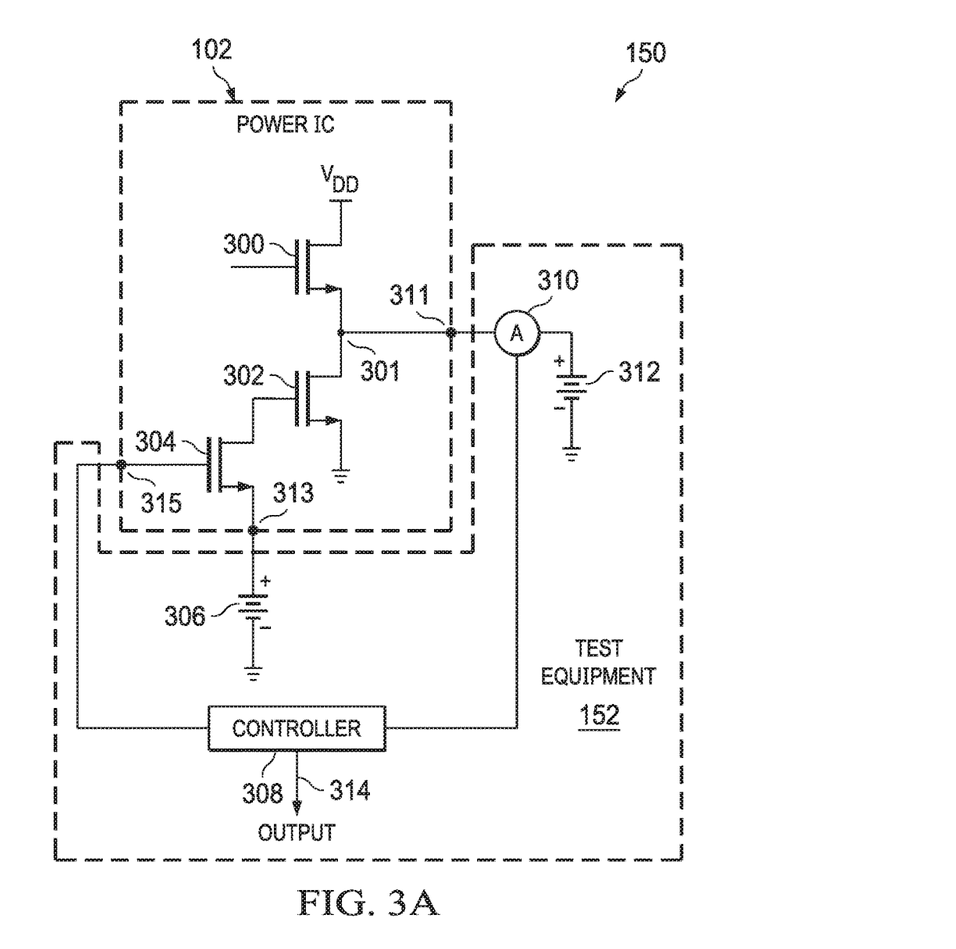
FIG. 3A depicts a circuit schematic diagram of a test system comprising a power IC and test equipment, in accordance with an example.

FIG. 3A depicts a circuit schematic diagram of an example test system 150. The test system 150 includes an example power IC 102 and example test equipment 152. More specifically, the power IC 102 includes a power MOSFET 300 (e.g., n-type power MOSFET) and a power MOSFET 302 (e.g., n-type power MOSFET). A drain of the power MOSFET 300 couples to a voltage source VDD, and a source of the power MOSFET 300 couples to an output node 301, which, in turn, couples to an IC pin 311. A gate of the power MOSFET 300 is usable to control the power MOSFET 300, although no specific connection for this gate is shown in FIG. 3A, nor is any such specific connection necessary for the present description. In an example, however, the gate of the power MOSFET 300 is usable to test leakage current in the power MOSFET 300 using the same techniques described below for testing leakage current in the power MOSFET 302.

The power MOSFET 302 has a drain that couples to the output node 301. A source of the power MOSFET 302 couples to ground. A gate of the power MOSFET 302 couples to a switch 304. In FIG. 3A, the switch 304 is represented as a MOSFET (e.g., n-type MOSFET), but in other examples, other types of switches are used. The gate of the power MOSFET 302 couples to a drain of the switch 304. A source of the switch 304 couples to a voltage source 306 via IC pin 313, which, in turn, couples to ground. A gate of the switch 304 couples to a controller 308 via IC pin 315. In the example depicted in FIG. 3A, the voltage source 306 and the controller 308 are not part of the power IC 102, although in some examples, these components are part of the power IC 102.

In an example, the voltage source 306 is a fixed voltage source that provides a fixed voltage, and in another example, the voltage source 306 is a variable voltage source that provides a variable voltage. In an example, the voltage source 306 provides a positive voltage between the source of the switch 304 and ground, as shown. This polarity for the voltage source 306 is used when the power MOSFETs 300, 302 and the switch 304 are n-type MOSFETs. When the power MOSFETs 300, 302 and the switch 304 are p-type MOSFETs, the polarity of the voltage source 306 is reversed, as described further below.

In the example of FIG. 3A, the voltage source 306 and the controller 308 are parts of test equipment 152. The controller 308 has an output 314 whereby the controller 308 provides desired information, such as leakage current test results and/or leakage current predictions based on the leakage current test results. The controller 308 couples to a current measurement device 310 (e.g., an ammeter). The current measurement device 310, in turn, couples to the output node 301 via the aforementioned IC pin 311 and to a voltage source 312. In the example of FIG. 3A, the voltage source 312 provides a fixed voltage with a positive polarity between the ammeter 310 and ground. The operation of the example test system 150 is described further below.

Figure 3B:
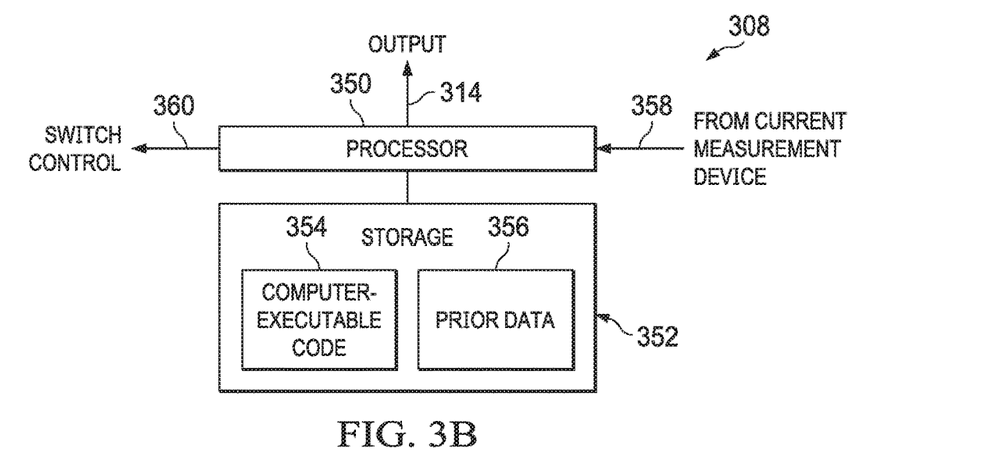
FIG. 3B depicts a block diagram of a controller for a power IC and test equipment, in accordance with an example.

FIG. 3B depicts a block diagram of an example controller 308. The controller 308 includes a processor 350 coupled to storage 352 (e.g., random access memory, read only memory, other any other type of memory). The storage 352, in turn, includes computer-executable code 354 and prior data 356. In an example, the prior data 356 comprises a data structure, such as a database, populated with data usable to perform extrapolation calculations and leakage current predictions as described further below. The processor 350 has an input 358 from the current measurement device 310, the output 314 mentioned above, and a switch control output 360 that couples to the gate of the switch 304 to control the switch 304. Although details of the operation of the controller 308 are provided below, in general, the processor 350 executes the computer-executable code 354, which causes the processor 350 to perform some or all of the actions attributed herein to the controller 308. In addition, the processor 350—as a result of executing the computer-executable code 354—accesses the prior data 356 to perform some or all of the extrapolation calculations and leakage current predictions as described herein. To perform the aforementioned processes, the processor 350 controls the switching of the switch 304 via switch control output 360 and uses current measurements received from the current measurement device 310 to produce data for output on output 314. Other examples of a controller 308 are contemplated. For example, a circuit logic comprising flip-flops and logic gates is usable to implement some or all of the functions attributed herein to the processor 350.

The operation of the test system 150 is now described with reference to FIGS. 3A-7. The test system 150 has two operation modes, each of which is usable to test current leakage in the power MOSFET 302. A first operation mode is described below with regard to FIGS. 3A, 3B, 4, and 6. A second operation mode is subsequently described with regard to FIGS. 3A, 3B, 5, and 7.

Figure 6:
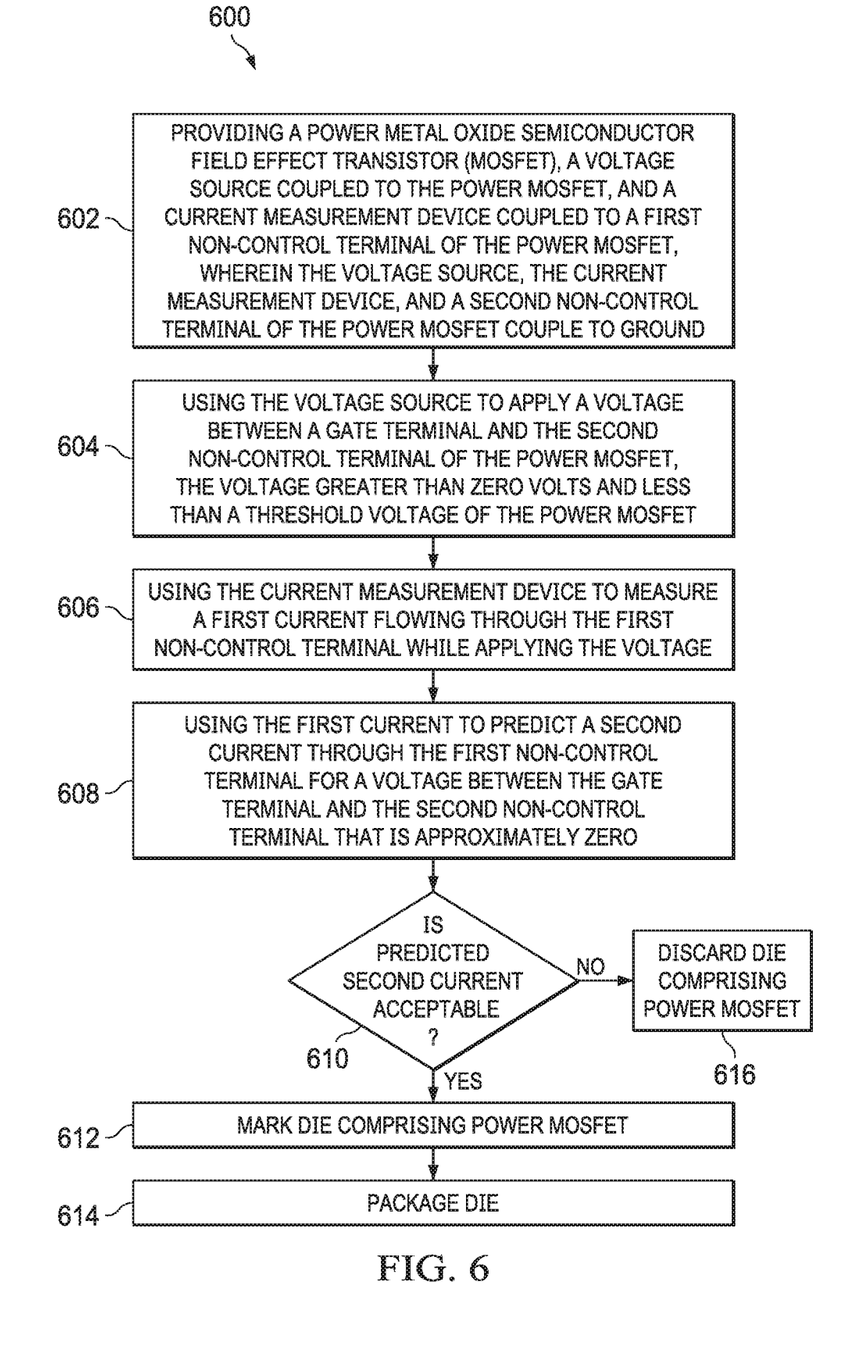
FIG. 6 depicts a flow diagram of a method for performing a current leakage test on a power IC using test equipment, in accordance with an example.

The first operation mode of the test system 150 is now described with regard to FIGS. 3A, 3B, 4, and 6. FIG. 6 depicts a method 600 performed by the processor 350 as a result of executing the computer-executable code 354. The method 600 begins by providing a power MOSFET 302, a voltage source 306 coupled (e.g., switchably coupled via switch 304) to the power MOSFET 302, and a current measurement device 310 coupled to a drain of the power MOSFET 302. The voltage source 306, the current measurement device 310, and a source of the power MOSFET 302 couple to ground (602).

The method 600 further comprises using the voltage source 306 to apply a voltage between a gate and the source of the power MOSFET 302 (604). To perform this step, the processor 350 provides a signal on switch control output 360 to turn on (close) the switch 304, thus causing the voltage from the voltage source 306 to be applied between the gate of the power MOSFET 302 and the source of the power MOSFET 302 via ground. As mentioned above, in an example, the voltage source 306 is a fixed voltage source 306 that provides a fixed voltage. In an example, the fixed voltage provided by the voltage source 306 is greater than 0 V but less than a threshold voltage (e.g., 0.7 V) of the power MOSFET 302. The fixed voltage is selected to be between 0 V and the threshold voltage because a voltage of 0 V would likely result in a leakage current that is too small to measure, as explained above. Conversely, a voltage at or exceeding the threshold voltage would cause the power MOSFET 302 to turn on, and thus the drain current of the power MOSFET 302 would no longer represent only leakage current. In an example, the fixed voltage is selected to be approximately 0.4 V.

Once the fixed voltage from the voltage source 306 is applied across the gate and source of the power MOSFET 302, a leakage current flows through the drain of the power MOSFET 302, the output node 301, and the current measurement device 310. In an example, the controller controlling the power MOSFET 300 turns off the power MOSFET 300 so that the current measurement device 310 is able to accurately measure leakage current through the power MOSFET 302 without being influenced by current through the power MOSFET 300. Because the Vgs applied to the power MOSFET 302 is significantly higher than 0 V, it renders negligible any influence from leakage current in the power MOSFET 300. (The voltage source 312 is provided as a substitute for VDD during testing because access to VDD is impeded by deactivation of the power MOSFET 300.) To that end, the method 600 comprises the processor 350 using the current measurement device 310 to measure the leakage current flowing through the drain of the power MOSFET 302 while applying the voltage from the voltage source 306 (606).

After the leakage current is measured, the method 600 comprises the processor 350 using the measured leakage current to predict a leakage current when the Vgs for the power MOSFET 302 is 0 V (608). In an example, the processor 350 accesses prior data 356, which contains a data structure cross-referencing various measured ambient temperatures and various Vgs values with various precisely-measured leakage currents, to calculate what the leakage current would be for the power MOSFET 302 if Vgs were 0 V. In an example, the processor 350 similarly calculates what the leakage current would be for the power MOSFET 302 if the ambient temperature were increased to a particular temperature. In an example, the processor 350 calculates what the leakage current would be for the power MOSFET 302 if both Vgs were 0 V and the ambient temperature were increased to a particular temperature.

In one example, prior data 356 is populated using current leakage data measured at different Vgs values and different ambient temperatures in a controlled lab environment equipped with shielded enclosures, temperature-controlled ovens and precision meters that average (e.g., integrate) measurements over an extended period of time to remove noise. Recorded values are stored as prior data 356, such as in a cross-referential format. Such recorded values can then be used to extrapolate leakage current for a given test condition (e.g., for specific Vgs and ambient temperature values).

The processor 350 provides these calculated, predicted leakage currents on output 314, such as a display device, an audio device, a storage device, or any other suitable device. Based on the predicted leakage current, the processor 350 is able to actuate a mechanism to mark the tested device as defective. For example, the processor 350 can cause a suitable mechanism to dispense a drop of ink, to move the defective device to a bin for defective devices, or to write data into the device signifying that the device is defective. In an example, when the method 600 is complete, the processor 350 opens the switch 304.

The steps of FIG. 6 are performed in a current leakage testing context. In at least some cases, current leakage testing is performed as part of a larger manufacturing process. In an example manufacturing process, a power IC is fabricated to include one or more power MOSFETs using any of a variety of fabrication techniques. After fabrication is complete, the power MOSFET is subjected to any of a variety of tests, including the test of method 600. The result of the method 600 is usable to make determinations as to whether the predicted second current is acceptable (610). For instance, if the calculated, predicted leakage currents fall below a threshold current level, the second current may be acceptable, in which case the method comprises marking the die (IC) containing the power MOSFET (e.g., using ink) (612) and packaging the IC (614). Otherwise, the IC is discarded (616). This disclosure is intended to encompass any and all such examples of manufacturing processes that include the method 600.

Figure 4:
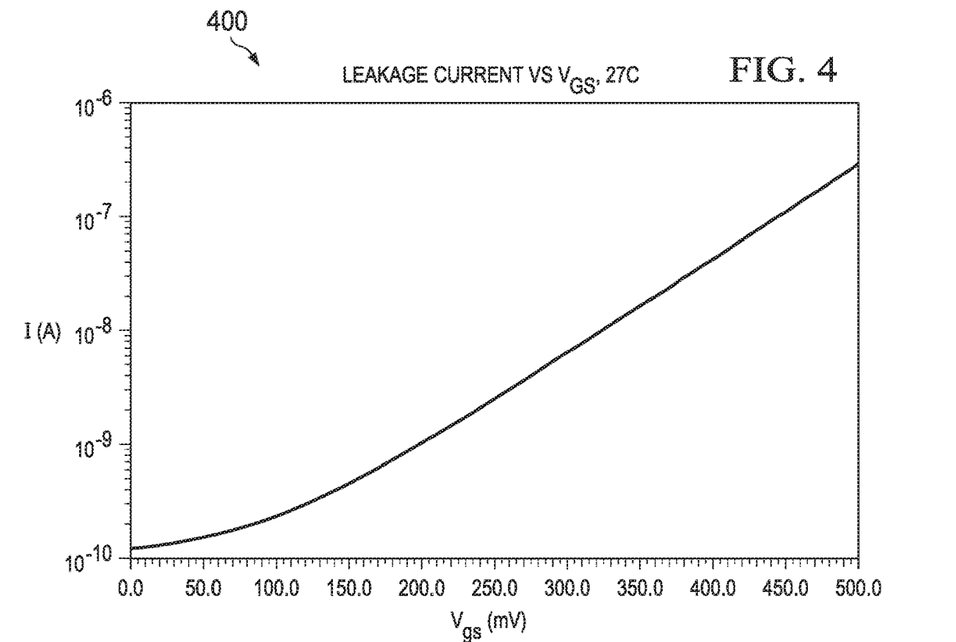
FIG. 4 depicts a graph of power metal oxide semiconductor field effect transistor (MOSFET) leakage current as a function of gate-source voltage, in accordance with an example.

FIG. 4 depicts a graph 400 of the leakage current of the power MOSFET 302 as a function of the Vgs of the power MOSFET 302, at room temperature and in accordance with an example. As the curve depicts, the leakage current is proportional to exp (Vgs). Selecting a Vgs higher than 0 V but less than the threshold voltage of the power MOSFET 302 produces a higher leakage current. As explained in detail above, the measured leakage current is usable to calculate the leakage current at Vgs=0 V, higher temperatures, or both.

Figure 7:
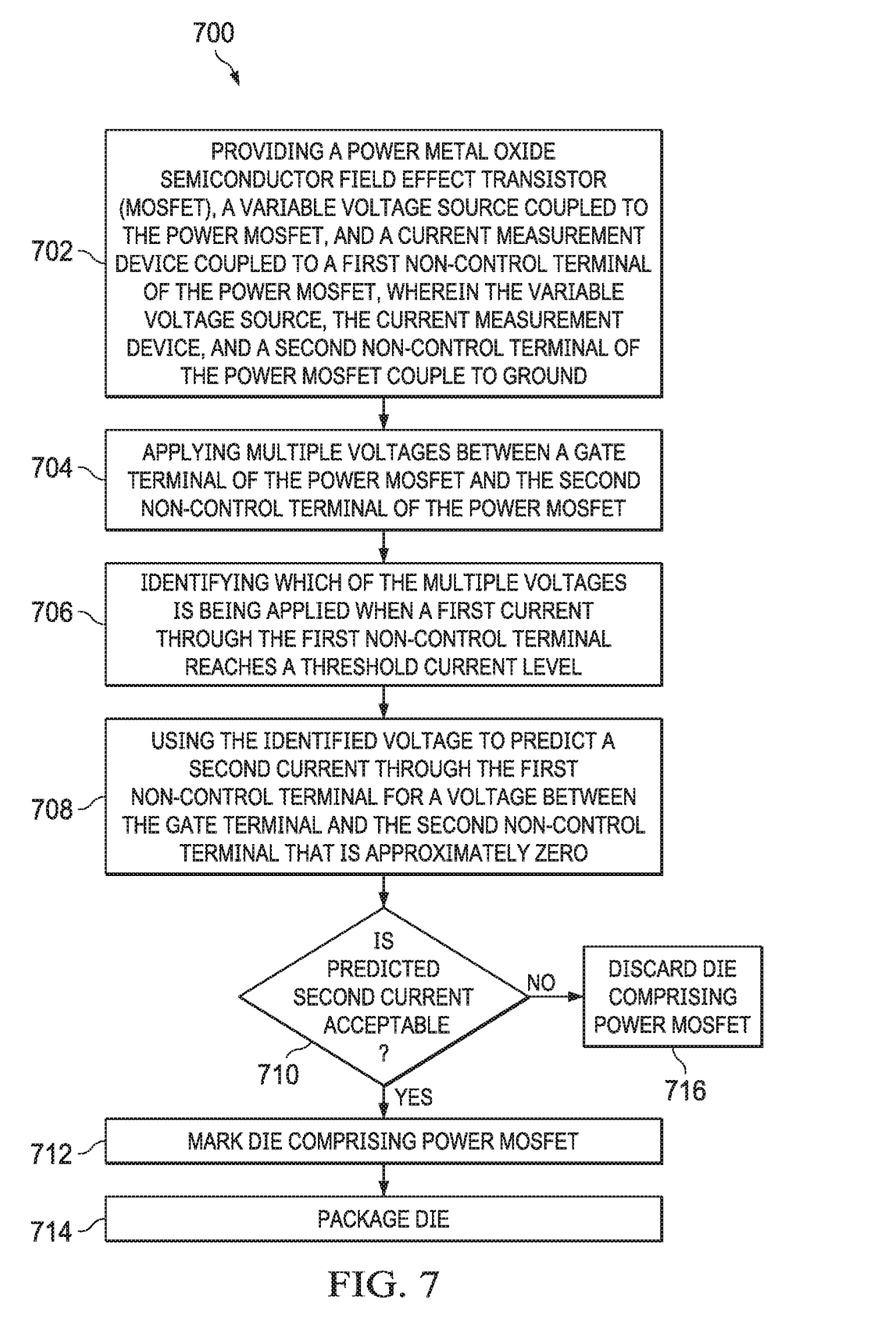
FIG. 7 depicts a flow diagram of another method for performing a current leakage test on a power IC using test equipment, in accordance with an example.

The second operation mode of the test system 150 is now described with regard to FIGS. 3A, 3B, 5, and 7. FIG. 7 depicts a method 700 performed by the processor 350 as a result of executing the computer-executable code 354. The method 700 begins by providing a power MOSFET 302, a variable voltage source 306 coupled to the power MOSFET 302 and controlled by the controller 308 (e.g., by the processor 350), and a current measurement device 310 coupled to a drain of the power MOSFET 302. The voltage source 306, the current measurement device 310, and a source of the power MOSFET 302 couple to ground (702).

The method 700 further comprises the processor 350 applying multiple voltages between the gate of the power MOSFET 302 and the source of the power MOSFET 302 (704). To perform this step, the processor 350 provides a signal on switch control output 360 to turn on (close) the switch 304, thus causing the voltages from the variable voltage source 306 to be applied between the gate of the power MOSFET 302 and the source of the power MOSFET 302 via ground. The application of these multiple voltages may be referred to as a voltage sweep, with the granularity of the voltage sweep to be determined by, e.g., the user performing the test. In an example, the sweep is performed for voltages between 0 V and the threshold voltage of the power MOSFET 302. In an example, the voltage sweep does not include 0 V. In an example, the sweep is performed in an ascending manner. In an example, the processor 350 controls the variable voltage source 306.

The method 700 next includes the processor 350 identifying which of the multiple voltages applied to the power MOSFET 302 is being applied when a leakage current through the power MOSFET 302 (e.g., a drain current flowing through the current measurement device 310) reaches a threshold current level (706). To perform this step, in an example the processor 350 monitors measurements performed by the current measurement device 310 and compares the received measurement data to the threshold current level. In an example, the processor 350 performs the voltage sweep and stops sweeping when the measured leakage current meets or exceeds the threshold current level.

In an example, the processor 350 performs the voltage sweep, recording measured leakage current data in storage 352 and comparing the recorded data to the threshold current level after completing the sweep. Other techniques are also contemplated. During the sweep and measurement of leakage currents, the power MOSFET 300 is off. The processor 350 designates the identified voltage as the threshold voltage of the power MOSFET 302, for example, by recording the identified voltage in an area of the storage 352 specifically allocated for the threshold voltage of the power MOSFET 302.

The method 700 subsequently comprises the processor 350 using the identified threshold voltage to predict a leakage current through the drain of the power MOSFET 302 when Vgs=0 V (708). In an example, the processor 350 accesses prior data 356, which contains a data structure cross-referencing various measured ambient temperatures, various Vgs values, various precisely-measured leakage currents, and various threshold voltages, to determine what the leakage current would be for the power MOSFET 302 if Vgs were 0 V. In an example, the processor 350 similarly determines what the leakage current would be for the power MOSFET 302 if the ambient temperature were increased to a particular temperature. In an example, the processor 350 determines what the leakage current would be for the power MOSFET 302 if both Vgs were 0 V and the ambient temperature were increased to a particular temperature. Prior data 356 may be obtained as explained above and used to extrapolate leakage current values for particular conditions (e.g., specific Vgs and ambient temperature conditions). The processor 350 provides these calculated, predicted leakage currents on output 314, such as a display device, an audio device, a storage device, or any other suitable device.

The steps of FIG. 7 are performed in a current leakage testing context. In at least some cases, current leakage testing is performed as part of a larger manufacturing process. In an example manufacturing process, a power IC is fabricated to include one or more power MOSFETs using any of a variety of fabrication techniques. After fabrication is complete, the power MOSFET is subjected to any of a variety of tests, including the test of method 700. The result of the method 700 is usable to make determinations as to whether the predicted second current is acceptable (710). For instance, if the calculated, predicted leakage currents fall below a current threshold level, the IC is deemed acceptable and may be marked (e.g., using ink) (712) and packaged (714). Otherwise, the die is discarded (716). This disclosure is intended to encompass any and all such examples of manufacturing processes that include the method 700.

Figure 5:
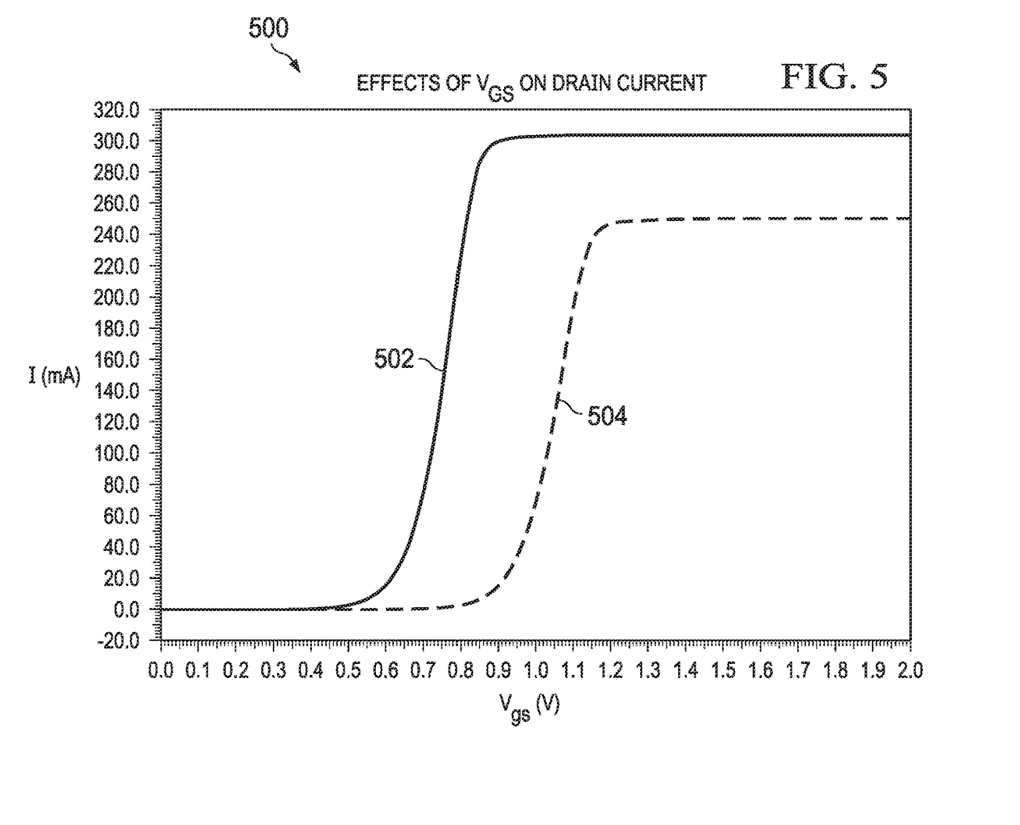
FIG. 5 depicts a graph demonstrating a sweep of a power MOSFET gate-source voltage to determine a threshold voltage, in accordance with an example.

FIG. 5 depicts a graph 500 showing Vgs sweeps from 0 V to 2 V for two different power MOSFETs. Curve 502 corresponds to a defective power MOSFET, and curve 504 corresponds to a normal power MOSFET. As each of the curves 502, 504 demonstrates, the initial Vgs rise from 0 V does not produce enough leakage current to be visible on a milliamp scale. However, curve 502 depicts a rise in drain current at a lower Vgs than does curve 504. If, for example, the threshold current level is set at 5 mA, the processor 350 would determine the Vt for curve 502 to be approximately 0.55 V and the Vt for curve 504 to be approximately 0.85 V. The processor 350 would use these Vt values to calculate a predicted leakage current when Vt=0 V, when ambient temperature is high, or both, as explained above.

Figure 8:
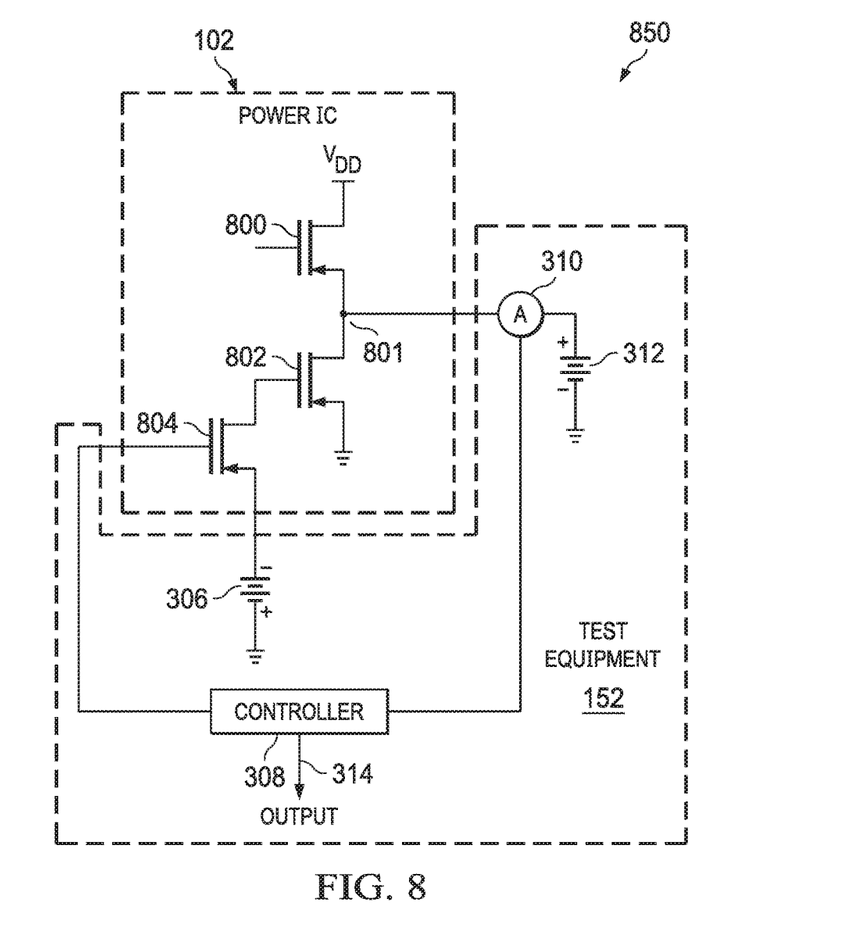
FIG. 8 depicts a circuit schematic diagram of another test system comprising a power IC and test equipment, in accordance with an example.

FIG. 8 depicts a circuit schematic diagram of a test system 850, in accordance with an example. The test system 850 is identical to the test system 150 described above, with the exception that the MOSFETs of the power IC 102 are p-type MOSFETs instead of n-type MOSFETs, and that the polarity of the voltage source 306 is reversed. The polarity of the voltage source 306 is reversed because p-type MOSFETs use negative Vgs values to form drain-source channels. The remainder of the structure and operation of the test system 850 is similar to that described in detail above for the test system 150. Various other examples are contemplated, including those with varying combinations of n-type MOSFETs and p-type MOSFETs.

Figure 9:
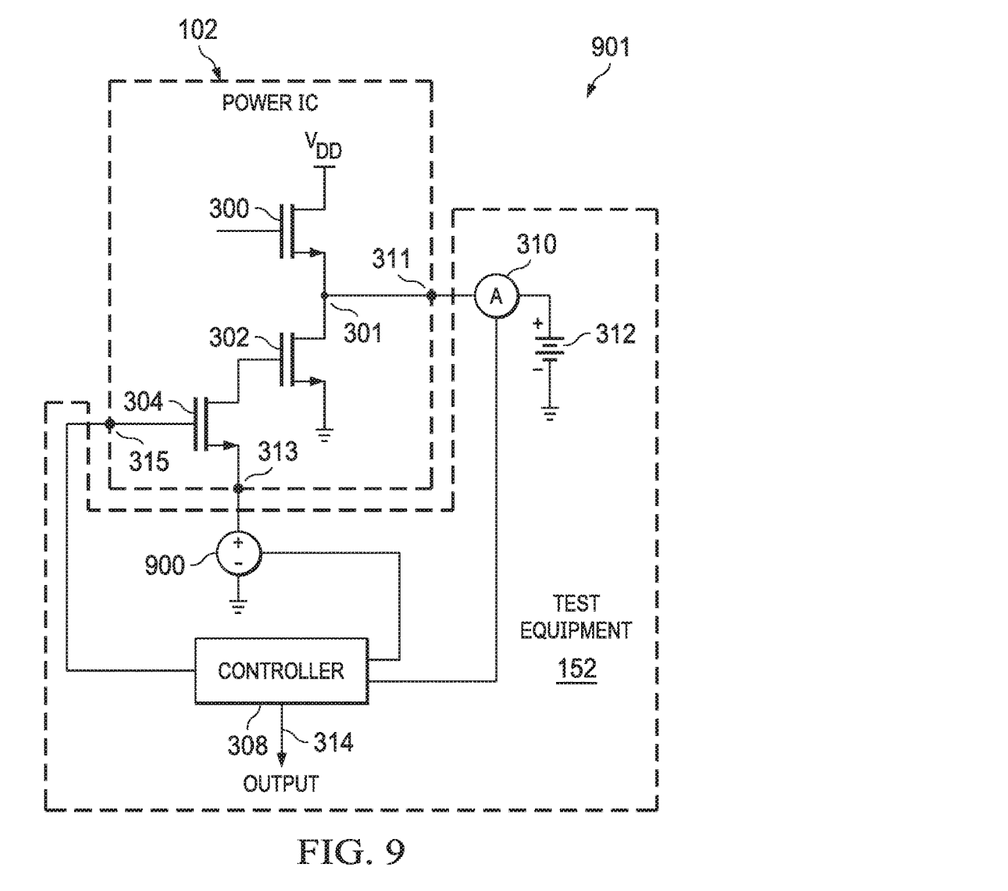
FIG. 9 depicts a circuit schematic diagram of another test system comprising a power IC and test equipment, in accordance with an example.

FIG. 9 depicts a circuit schematic diagram of a test system 901, in accordance with an example. The test system 901 is identical to the test system 150 of FIG. 3A described above, with the exception that the fixed voltage source 306 is replaced by a dynamically controllable voltage source 900. The voltage source 900 is controllable by the controller 308, for example. As explained above, the leakage current of the power MOSFET 302 is exacerbated at high ambient temperatures. It is useful to determine the extent of leakage current that would be present at high ambient temperatures to determine whether the IC 102 should be discarded during production. Accordingly, the controller 308 is configured to perform a method 1000 as depicted in FIG. 10 to increase the temperature of the power MOSFET 302 and to measure the leakage current of the power MOSFET 302 while the power MOSFET 302 is warm.

Figure 10:
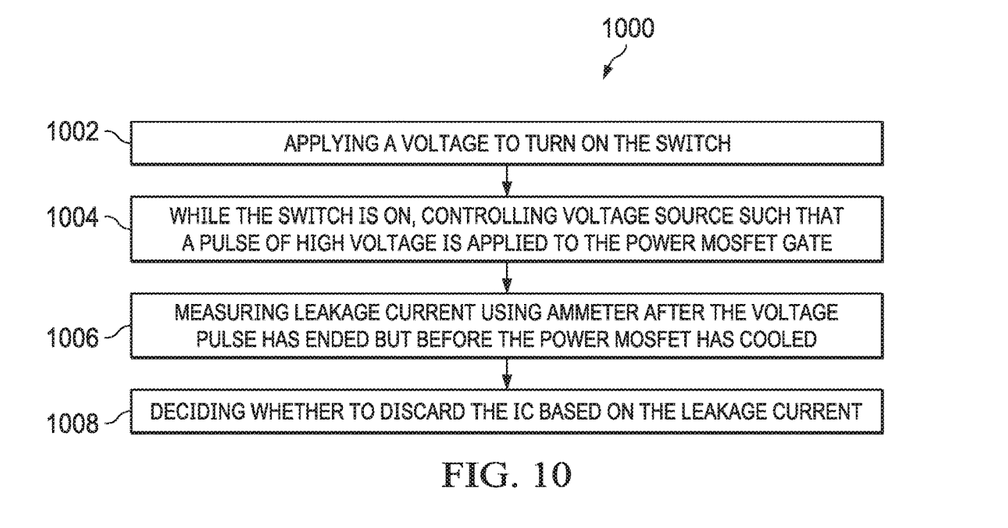
FIG. 10 depicts a flow diagram of a method for performing a current leakage test on a power IC using test equipment, in accordance with an example.

Specifically, and referring to both FIGS. 9 and 10, the controller 308 is configured to apply a voltage at pin 315 such that MOSFET 304 turns on (1002), and while MOSFET 304 is on, the controller 308 is further configured to control the voltage source 900 such that a pulse of high voltage (e.g., that exceeds the threshold voltage of power MOSFET 302) is applied to the gate of power MOSFET 302 (1004). The voltage applied should be sufficiently high above the source voltage (e.g., ground) of the power MOSFET 302 such that the power MOSFET 302 is placed in the linear region. The voltage applied to the gate of the power MOSFET 304 should be sufficiently high than when the voltage source 900 is pulsed, the MOSFET 304 remains on.

When the power MOSFET 302 is on, it draws a high current from the voltage source 312. The combination of high voltage (provided by the voltage source 312) and high current causes power dissipation in the power MOSFET 302. The power dissipation lasts for a time determined by the time duration of the voltage pulse generated by the voltage source 900, thereby providing a fixed energy pulse that is the product of the high current, the high voltage, and the time duration of the voltage pulse from the voltage source 900. This energy pulse increases the temperature of the power MOSFET 302, and the temperature remains elevated until the thermal time constant of the system decays. In an example, the voltage pulse is 2 microseconds. Thermal time constants can be milliseconds long, which provides an opportunity for the controller 308 to measure leakage current using the ammeter 310 after the voltage pulse has ended but before the power MOSFET 302 has cooled (1006). In an example, the controller 308 measures the leakage current as soon as possible after the voltage pulse has ended since the temperature is highest, although in other examples, the leakage current is measured at a later time. In an example, the controller 308 (e.g., the storage 352, FIG. 3B) is programmed with the requisite data described above to determine a target time to measure the leakage current using the ammeter 310. Based on the measured leakage current, a decision is made to discard or not discard the IC 102 (1008). The example of FIG. 9 can be re-configured to use p-type MOSFETs, as in FIG. 8.

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value. If the stated value is 0, then such terms mean plus or minus 0.1 units from 0. The term "control terminal" refers to a control terminal of a MOSFET, such as a gate terminal. The term "non-control terminal" refers to a non-control terminal of a MOSFET, such as a drain or source terminal.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A process, comprising:
   providing a power transistor having a first non-control terminal, a second non-control terminal, and a gate, a first voltage source coupled to the first non-control terminal of the power transistor, and a current measurement device coupled to the first non-control terminal of the power transistor, the first voltage source, the current measurement device, and the second non-control terminal of the power transistor being coupled to ground;
   using a second voltage source to apply a gate voltage between the gate terminal and the second non-control terminal of the power transistor, the gate voltage being greater than zero volts and less than a threshold voltage of the power transistor;
   using the current measurement device to measure a first current flowing through the first non-control terminal while applying the gate voltage; and
   using the first current to predict a second current through the first non-control terminal for a voltage between the gate terminal and the second non-control terminal that is approximately zero.

2. The process of claim 1, in which the power transistor is an n-type power transistor, and the first voltage between the gate terminal and the second non-control terminal is a gate terminal-to-source terminal voltage (Vgs).

3. The process of claim 1, in which the power transistor is a p-type power transistor, and the first voltage between the gate terminal and the second non-control terminal is a source terminal-to-gate terminal voltage (Vsg).

4. The process of claim 1, including discarding the power transistor based on the second current.

5. The process of claim 1, in which the first non-control terminal is a drain terminal of the power transistor.

6. The process of claim 1, in which the gate voltage is a fixed voltage.

7. The process of claim 1, in which the second non-control terminal is a source terminal.

8. The process of claim 1, including actuating a switch coupled to the gate terminal of the power transistor.

9. A process, comprising:
   (a) providing a power transistor having a first non-control terminal, a second non-control terminal, a gate, and a threshold voltage;
   (b) coupling a first voltage source to the first non-control terminal of the power transistor;
   (c) coupling a current measurement device to the first non-control terminal of the power transistor;
   (d) coupling the first voltage source, the current measurement device, and the second non-control terminal of the power transistor to ground;
   (e) applying a gate voltage greater than zero volts and less than the threshold voltage of the power transistor between the gate terminal and the second non-control terminal of the power transistor using a second voltage source;
   (f) measuring a first current flowing through the first non-control terminal while applying the gate voltage using the current measurement device; and
   (g) using the first current, predicting a second current through the first non-control terminal for a voltage between the gate terminal and the second non-control terminal that is approximately zero.

10. The process of claim 9 in which the applying includes applying a fixed gate voltage.

11. The process of claim 9 in which applying includes applying multiple gate voltages in a voltage sweep.

12. The process of claim 9 in which applying includes applying multiple gate voltages in a voltage sweep until the first current reaches a threshold current level.

13. The process of claim 9 including isolating the first non-control terminal from a voltage source.

14. The process of claim 9 in which the coupling a first voltage source to the first non-control terminal of the power transistor includes coupling the first voltage source to an output node 15. The process of claim 9 in which the coupling a current measurement device to the first non-control terminal of the power transistor includes coupling the current measurement device between an output node coupled to the first non-control terminal and the first voltage source.

16. The process of claim 9 in which the predicting includes calculating leakage current when the voltage between the gate terminal and the second non-control terminal of the power transistor is zero volts.

17. The process of claim 9 in which the applying includes applying a voltage pulse.

* * * * *